United States Patent
Ryu

(10) Patent No.: US 8,455,159 B2
(45) Date of Patent: Jun. 4, 2013

(54) METHOD FOR CORRECTING CRITICAL DIMENSION OF PHASE SHIFT MASK AND METHOD FOR MANUFACTURING THE SAME

(75) Inventor: Choong Han Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 13/228,915

(22) Filed: Sep. 9, 2011

(65) Prior Publication Data

US 2012/0061349 A1     Mar. 15, 2012

(30) Foreign Application Priority Data

Sep. 13, 2010    (KR) .......................... 10-2010-0089598

(51) Int. Cl.
     *G03F 1/26*        (2012.01)
(52) U.S. Cl.
     USPC ...................... 430/5; 430/30; 716/52; 716/54

(58) Field of Classification Search
     USPC ...................................... 430/5, 30; 716/52, 54
     See application file for complete search history.

(56) References Cited

FOREIGN PATENT DOCUMENTS

| | | |
|---|---|---|
| JP | 2001068398 A | 3/2001 |
| KR | 100604940 B1 | 7/2006 |
| KR | 1020060080309 A | 7/2006 |
| KR | 1020070068910 A | 7/2007 |
| KR | 100762244 B1 | 9/2007 |

*Primary Examiner* — Christopher Young
(74) *Attorney, Agent, or Firm* — William Park & Associates Patent Ltd.

(57) ABSTRACT

A method for correcting the critical dimension (CD) of a phase shift mask includes calculating an intensity slope quantifying a slope of an intensity waveform of secondary electrons emitted by scanning an electron beam spot to a hard mask pattern on a phase shift mask on a substrate, extracting a delta critical dimension (CD) value, which is equal to a CD difference between the phase shift pattern and the hard mask pattern, as a delta CD value corresponding to the intensity slope, and correcting the CD of the phase shift mask by using the extracted delta CD value.

18 Claims, 11 Drawing Sheets

METHOD FOR CORRECTING CRITICAL DIMENSION OF PHASE SHIFT MASK AND METHOD FOR MANUFACTURING THE SAME

CROSS-REFERENCES TO RELATED APPLICATIONS

The present application claims priority under 35 U.S.C 119(a) to Korean Application No. 10-2010-0089598, filed on Sep. 13, 2010, in the Korean intellectual property Office, which is incorporated herein by reference in its entirety set forth in full.

BACKGROUND

Exemplary embodiments of the present invention relate to a photomask, and more particularly, to a method for correcting a critical dimension (CD) of a phase shift mask and a method for manufacturing the same.

In general, a semiconductor device includes various patterns. Such patterns are formed through a photolithography process and an etching process. As an example, a photoresist layer with solubility changing by light irradiation is formed on a pattern target layer on a semiconductor wafer. A predetermined region of the photoresist layer is exposed using a photomask, and a portion with solubility changed with respect to a developer is removed to form a photoresist pattern. The pattern target layer exposed by the photoresist pattern is etched and removed to form a pattern. However, as the integration density of semiconductor devices increases, the size of patterns decreases. Accordingly, in forming a pattern through a photolithography process, a pattern failure caused by resolution degradation may occur. Accordingly, researches are being conducted to develop various resolution enhancement techniques (RETs) that can enhance the resolution. One of the resolution enhancement techniques is a method using a phase shift photomask. The phase shift photomask includes a phase shift pattern on a transparent substrate and controls the phase of light by the phase shift pattern, thereby improving the resolution.

FIGS. 1 to 4 are cross-sectional views illustrating a method for manufacturing a known phase shift mask. FIG. 5 is a cross-sectional view illustrating the CD difference between a hard mask pattern and a phase shift pattern of a phase shift mask.

As illustrated in FIG. 1, a phase shift layer 110 and a hard mask layer 120 are formed on a substrate 100. A resist pattern 130 is formed on the hard mask layer 120. An etching process using the resist pattern 130 as an etch mask is performed to remove an exposed portion of the hard mask layer 120 and also an exposed portion of the phase shift layer 110. By this etching process, a phase shift pattern 112 and a hard mask pattern are formed as illustrated in FIG. 2. As illustrated in FIG. 3, the resist pattern 130 is removed to form a sequential stack of the phase shift pattern 112 and the hard mask pattern 122. As illustrated in FIG. 4, a predetermined region of the hard mask pattern 122 is removed to expose the phase shift pattern 112. A region where the phase shift pattern 112 is exposed corresponds to a region where the patterns are transferred on the wafer, an example of which is a cell region. Also, a region where the hard mask pattern 122 remains corresponds to a region where the patterns are not transferred on the wafer, an example of which is a frame region of the photomask.

In this process, the phase shift pattern 112 must be formed to have a critical dimension (CD) (i.e., a pattern size) equal to a designed CD. However, in an actual process, some of the phase shift patterns 112 may have a CD different from the designed CD. In this case, the patterns transferred and formed on the wafer may also have a CD different from the designed CD, thus causing a malfunction of the device. Thus, the CD of the phase shift pattern 112 is corrected in the phase shift mask manufacturing process. The CD of the phase shift pattern 112 must be measured in order to correct the CD of the hard mask pattern 122. However, as illustrated in FIG. 3, the hard mask pattern 122 is formed on the phase shift pattern 112 after the removing of the resist pattern 130. Therefore, it is difficult to directly measure the CD of the phase shift pattern 112. Thus, the CD of the hard mask pattern 122 is measured, instead of directly measuring the CD of the phase shift pattern 112, and whether to correct the CD of the phase shift pattern 112 is determined according to the measurement results.

However, the hard mask pattern 122 is used as an etch barrier layer in the etching process for forming the phase shift pattern 112, and is formed of a different material than the phase shift pattern 112. Accordingly, the hard mask pattern 122 has a different etch rate than the phase shift pattern 112. Thus, as illustrated in FIG. 5, the CD1 of the phase shift pattern 112 with a relatively high etch rate may become smaller than the CD2 of the hard mask pattern 122 with a relatively low etch rate, after the performing of the etching process for forming the hard mask pattern 122 and the phase shift pattern 112. This difference between the CD1 of the phase shift pattern 112 and the CD2 of the hard mask pattern 122 is defined as a delta CD ΔCD. The delta CD ΔCD is equal to the difference between the CD Mean To Target (MTT) of the hard mask pattern 122 and the CD MTT of the phase shift pattern 112. Here, the CD MTT represents the difference between the actually-measured CD value and the designed CD value.

According to a known art, in order to correct the CD of the phase shift pattern 112, the CD, e.g., CD MTT of the hard mask pattern 122 is measured and the CD MTT of the phase shift pattern 112 is estimated to be the difference between the delta CD ΔCD and the measured CD MTT of the hard mask pattern 122. Then, an additional etching process is performed for correction by the estimated CD MTT of the phase shift pattern 112. However, the CD of the hard mask pattern 122 changes severely in its measurement process, thus exhibiting poor repeatability. The poor repeatability may be caused by various factors, an example of which is a steep side slope of the pattern profile of the hard mask pattern 122. Also, the measurement result may vary according to the measurement conditions or the states of the measurement equipment. When the CD measurement of the hard mask pattern 122 vary by various parameters according to the measurement conditions, the accuracy of the measured CD MTT of the hard mask pattern 122 decreases, thus making it difficult to calculate the accurate CD MTT of the phase shift pattern 112, although the delta CD ΔCD is accurate. When an additional etching process is performed on the basis of the inaccurate CD MTT of the phase shift pattern 112, the resulting CD of the phase shift pattern 112 may be greatly different from the designed CD. In addition, the delta CD ΔCD is predetermined through a plurality of test processes, but no correction is made to the delta CD ΔCD although the measurement conditions of the test processes performed to determine the delta CD ΔCD are different from the conditions of the measurement performed for actual correction.

SUMMARY

An embodiment of the present invention relates to a method for correcting a CD of a phase shift mask and a method for manufacturing the same. The method may improve the measurement repeatability of the CD (or CD MTT) of a hard mask pattern, thereby making it possible to calculate the accurate CD (or CD MTT) of a phase shift pattern. Also, the method corrects the delta CD ΔCD, thereby making it possible to make an accurate correction to the CD of the phase shift pattern.

In one embodiment, a method for correcting the CD of a phase shift mask includes: calculating an intensity slope quantifying a slope of an intensity waveform of secondary electrons emitted by scanning an electron beam spot to a hard mask pattern on a phase shift mask on a substrate; extracting a delta CD value, which is equal to a CD difference between the phase shift pattern and the hard mask pattern, as a delta CD value corresponding to the intensity slope; and correcting the CD of the phase shift mask by using the extracted delta CD value.

The calculating of the intensity slope may include: a first measurement operation of measuring the CD of the hard mask pattern on the basis of a first intensity value of the secondary electrons; a second measurement operation of measuring the CD of the hard mask pattern on the basis of a second intensity value of the secondary electrons; and calculating a slope of a straight line, which passes through first coordinates included of the first intensity value and a first measurement value measured by the first measurement operation and second coordinates included of the second intensity value and a second measurement value measured by the second measurement operation, as the intensity slope.

The first measurement operation and the second measurement operation may be performed using a scanning electron microscopy (SEM) equipment. The first intensity value may be set to approximately 80% of the maximum intensity of the secondary electrons, and the second intensity value may be set to approximately 20% of the maximum intensity of the secondary electrons.

The extracting of the delta CD value may be performed using a functional equation with variables of the intensity slope and the delta CD.

The functional equation may be prepared in advance through a plurality of test operations.

The preparing of the functional equation may include: a first operation of measuring a first CD value and a second CD value for the hard mask pattern on the basis of a first intensity value and a second intensity value of the secondary electrons that are different from each other; a second operation of calculating an intensity slope by using the first intensity value, the second intensity value, the first CD value and the second CD value; a third operation of calculating a delta CD by measuring the CD of the phase shift pattern after removing the hard mask pattern; and defining a functional equation applied to the respective delta CDs corresponding to the intensity slopes obtained by repeating the first operation, the second operation and the third operation a predetermined number of times.

The phase shift pattern may be additionally etched using a plasma-based etching process.

In another embodiment, a method for manufacturing a phase shift mask includes: forming a hard mask pattern on a phase shift layer on a substrate; forming a phase shift pattern by etching the phase shift layer by using the hard mask pattern as an etch mask; calculating an intensity slope quantifying a slope of an intensity waveform of secondary electrons emitted by scanning an electron beam spot to the hard mask pattern; extracting a delta CD value, which is equal to a CD difference between the phase shift pattern and the hard mask pattern, as a delta CD value corresponding to the intensity slope; correcting the CD of the phase shift mask by using the extracted delta CD value; and removing the hard mask pattern.

The calculating of the intensity slope may include: a first measurement operation of measuring the CD of the hard mask pattern on the basis of a first intensity value of the secondary electrons; a second measurement operation of measuring the CD of the hard mask pattern on the basis of a second intensity value of the secondary electrons; and calculating a slope of a straight line, which passes through first coordinates included of the first intensity value and a first measurement value measured by the first measurement operation and second coordinates included of the second intensity value and a second measurement value measured by the second measurement operation, as the intensity slope.

The first measurement operation and the second measurement operation may be performed using a scanning electron microscopy (SEM) equipment. The first intensity value may be set to approximately 80% of the maximum intensity of the secondary electrons, and the second intensity value may be set to approximately 20% of the maximum intensity of the secondary electrons.

The extracting of the delta CD value may be performed using a functional equation with variables of the intensity slope and the delta CD.

The functional equation may be prepared in advance through a plurality of test operations.

The preparing of the functional equation may include: a first operation of measuring a first CD value and a second CD value for the hard mask pattern on the basis of a first intensity value and a second intensity value of the secondary electrons that are different from each other; a second operation of calculating an intensity slope by using the first intensity value, the second intensity value, the first CD value and the second CD value; a third operation of calculating a delta CD by measuring the CD of the phase shift pattern after removing the hard mask pattern; and defining a functional equation applied to the respective delta CDs corresponding to the intensity slopes obtained by repeating the first operation, the second operation and the third operation a predetermined number of times.

The phase shift pattern may be additionally etched using a plasma-based etching process.

The phase shift layer may be formed using a molybdenum silicon film.

The hard mask pattern may be formed using a chrome film.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 13:
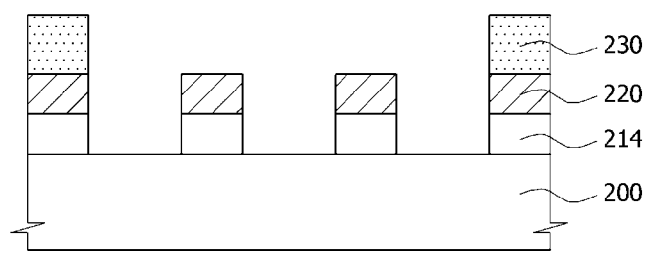
Figure 14:
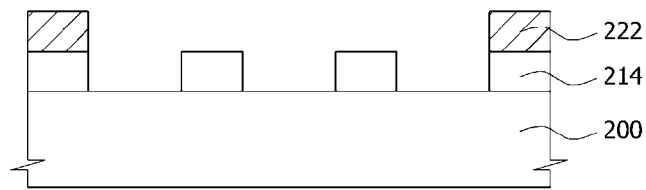
Figure 15:
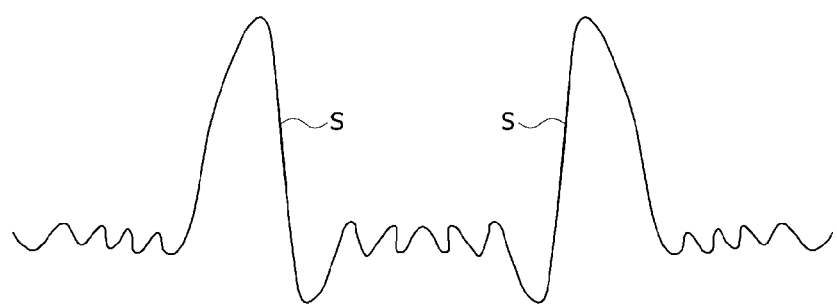
FIG. 15 is a graph illustrating an example of the intensity waveform of secondary electrons when measuring the CD of a hard mask pattern.
Figure 16:
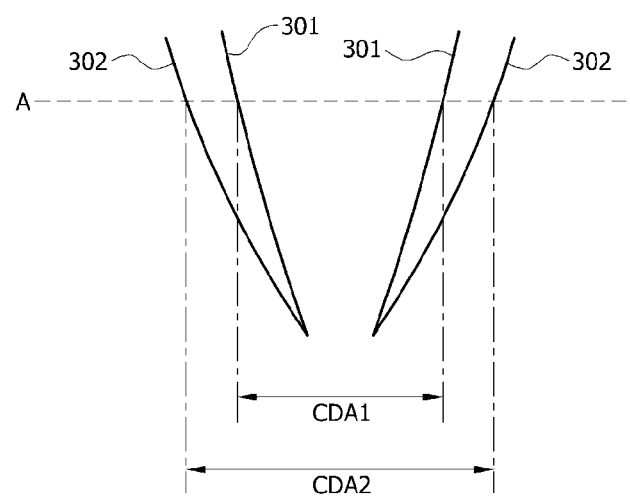
FIG. 16 is a diagram illustrating the CD value measured according to the slope of the intensity waveform of the secondary electrons of FIG. 15.
Figure 17:
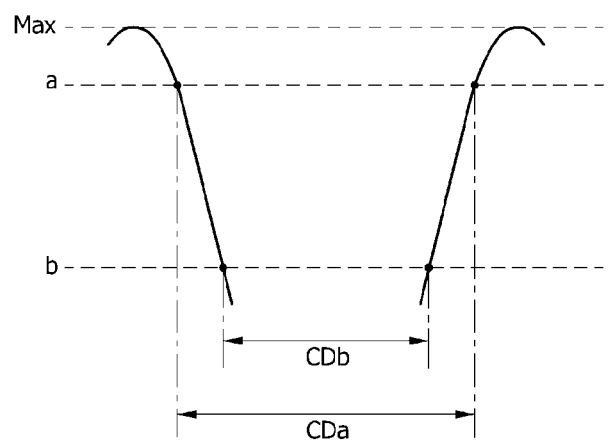
FIGS. 17 and 18 are diagrams illustrating a method for calculating an intensity slope IS.
Figure 18:
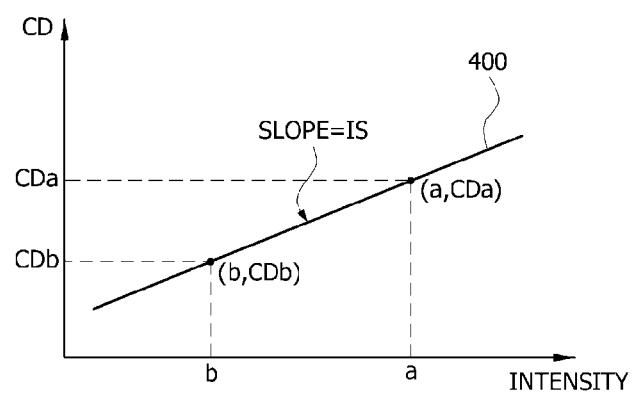

FIGS. 6 to 14 are cross-sectional views illustrating a method for manufacturing a phase shift mask according to an exemplary embodiment of the present invention. FIG. 15 is a graph illustrating an example of the intensity waveform of secondary electrons when measuring the CD of a hard mask pattern. FIG. 16 is a diagram illustrating the CD value measured according to the slope of the intensity waveform of the secondary electrons of FIG. 15. FIGS. 17 and 18 are diagrams illustrating a method for calculating an intensity slope IS.

Figure 1:
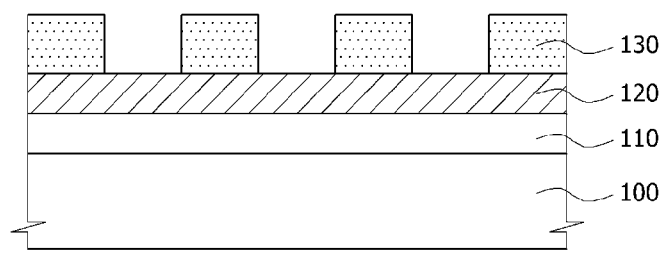
FIGS. 1 to 4 are cross-sectional views illustrating a method for manufacturing a general phase shift mask.
Figure 2:
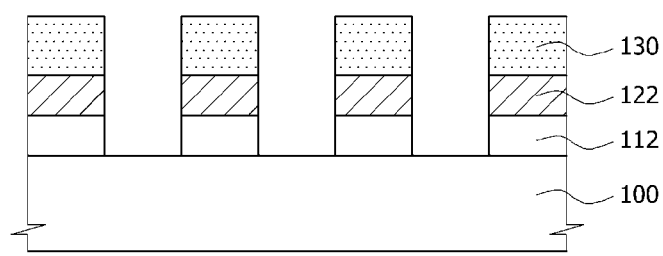
Figure 3:
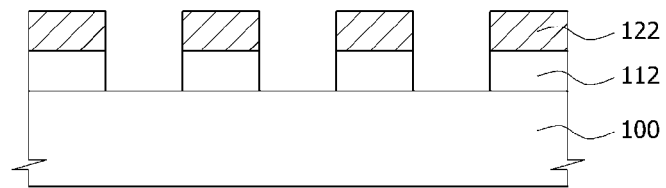
Figure 4:
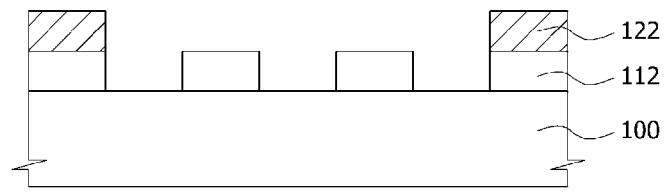
Figure 5:
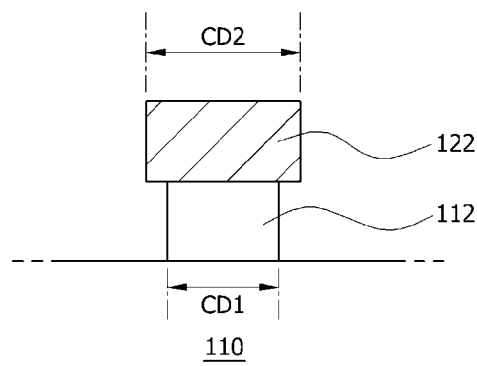
FIG. 5 is a cross-sectional view illustrating the CD difference between a hard mask pattern and a phase shift pattern of a phase shift mask.
Figure 6:
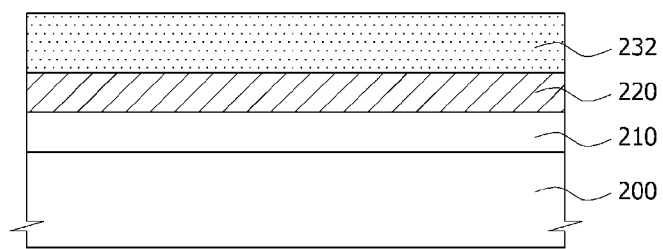
FIGS. 6 to 14 are cross-sectional views illustrating a method for manufacturing a phase shift mask according to an exemplary embodiment of the present invention.
Figure 7:
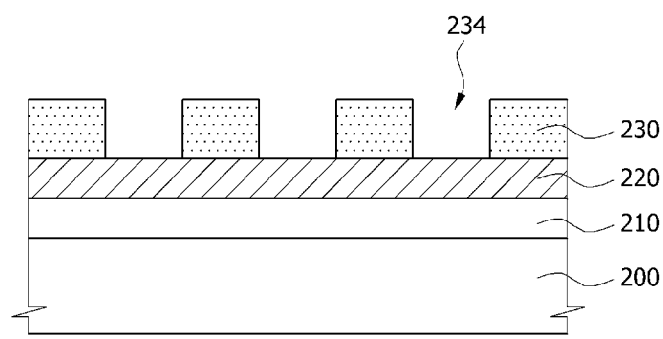

As illustrated in FIG. 6, a phase shift layer 210, a hard mask layer 220, and a resist layer 232 are sequentially formed on a transparent substrate 200 such as a quartz substrate. The phase shift layer 210 may be formed of a material having a partial light transmissivity at a certain wavelength. For example, the phase shift layer 210 is formed of molybdenum silicon (MoSi). The hard mask layer 220 may be formed of a material that can be used as an etch barrier layer in an etching process on the phase shift layer 210 and can remain in a region (e.g., a frame region where a pattern is not formed on the wafer) to block light. For example, the hard mask layer 220 is formed of chrome (Cr). As illustrated in FIG. 7, an electron beam (e-beam) based exposure/development process is performed on the resist layer 232 of FIG. 6 to form a resist pattern 230. The resist pattern 230 has an opening 234 that exposes a surface of the hard mask layer 220.

Figure 8:
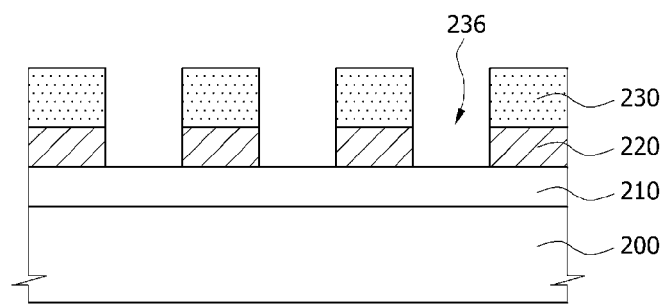
Figure 9:
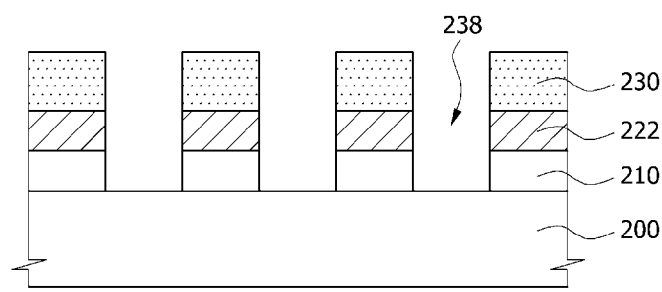

As illustrated in FIG. 8, an etching process using the resist pattern 230 as an etch mask is performed on the exposed hard mask layer 220 of FIG. 7 to form a hard mask pattern 222. The resist pattern 230 and the hard mask pattern 222 have an opening 236 that exposes a surface of the phase shift layer 210. The etching process for forming the hard mask pattern 222 may be performed using a dry etching process. As illustrated in FIG. 9, an etching process using the resist pattern 230 and the hard mask pattern 222 as an etch mask is performed on the exposed portion of the phase shift layer 210 of FIG. 8 to form a phase shift pattern 212. The resist pattern 230, the hard mask pattern 222 and the phase shift pattern 212 has an opening 238 that exposes a surface of the substrate 200. The etching process for forming the phase shift pattern 212 is performed in the same way as the etching process for forming the hard mask pattern 222. Thus, the etching process for forming the phase shift pattern 212 and the etching process for forming the hard mask pattern 222 are sequentially performed in the same etching equipment.

Figure 10:
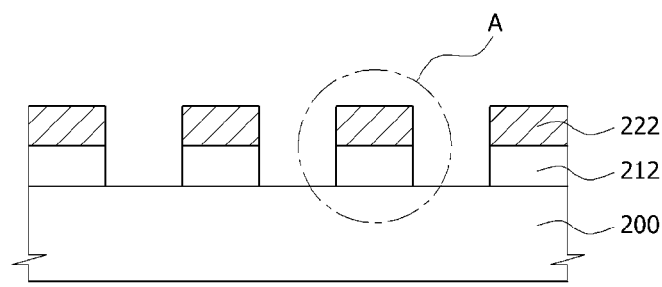

As illustrated in FIG. 10, the resist pattern 230 of FIG. 9 is removed to expose the hard mask pattern 222. FIG. 10 illustrates that the phase shift pattern 212 and the hard mask pattern 222 have the same CD. However, this is merely an ideal case, and the phase shift pattern 212 and the hard mask pattern 222 may have different CDs in practice. One of the main reasons for this is that the phase shift layer 210 and the hard mask layer 220 have different etch rates when being etched through a dry etching process. Specifically, referring to FIG. 11, the hard mask pattern 222 formed of chrome (Cr0) has a relatively large first CD CD1 due to a relatively low etch rate, whereas the phase shift pattern 212 formed of molybdenum silicon (MoSi) has a relatively small second CD CD2 due to a relatively high etch rate. In this state, the second CD CD2 of the phase shift pattern 212 must be measured in order to correct the CD of the phase shift pattern 212, but it is difficult to directly measure the second CD CD2 of the phase shift pattern 212 due to the hard mask pattern 222 on the phase shift pattern 212. Thus, the first CD CD1 of the hard mask pattern 222 is measured, and then the second CD CD2 of the phase shift pattern 212 is calculated on the basis of the measured first CD CD1 of the hard mask pattern 222.

The CD of the phase shift pattern 212 is measured using a scanning electron microscopy (SEM) equipment. In a state where the hard mask pattern 222 and the phase shift pattern 212 are formed (see FIG. 10), an electron beam spot is formed on the surface of the phase shift mask, and the formed electron beam spot is scanned on the region of the phase shift mask to obtain a profile image. Among various types of radiations generated in this process, secondary electrons generated in the region nearest to the surface of the phase shift mask are used to output the image. If an SEM equipment is used to measure the CDs of the phase shift patterns 212, the measured CDs value may vary even though the profiles of the hard mask patterns (222), according to the waveform of the secondary electrons emitted from the surface of the phase shift mask, are same. In particular, if the slopes of the intensity waveforms of the secondary electrons differ, the measured CD values also differ.

This will be described in detail with reference to the drawings. FIG. 15 illustrates the waveform representing the intensity distribution of the secondary electrons. As illustrated in FIG. 15, the waveform representing the intensity of the secondary electron has a certain slope S. The slope S is determined by the electron beam current and the image focusing of the SEM equipment. Thus, the slope S may differ according to the conditions of the image focusing and the electron beam current in each measurement, and the measured CD values differ even for the same pattern profile. Specifically, as illustrated in FIG. 16, the CD value CDA1, measured at a certain intensity in the case where the intensity waveform of the secondary electrons is relatively large (denoted by '301'), differs from the CD value CDA2 measured at the same intensity in the case where the intensity waveform of the secondary electrons is relatively small (denoted by '302'). That is, in spite of the same target pattern, the slope of the intensity waveform of the secondary electrons may differ in each measurement according to various factors such as the state of the measurement equipment, and thus the CD value of the hard mask pattern 222 may differ in each measurement.

In order to reduce such difference, a process of measuring the CD of the hard mask pattern 222 is divided into two operations; a first measurement operation and a second measurement operation. This will be described in detail with reference to the drawings. As illustrated in FIG. 17, a first measurement operation of measuring the CD (or CD MTT) on the basis of a first intensity value 'a' at the intensity waveform of the secondary electrons obtained from the measurement result is performed, and then a second measurement operation of measuring the CD (or CD MTT) on the basis of a second intensity value 'b' is performed. As an example, the first intensity value 'a' is set to approximately 80% of the maximum intensity value Max, and the second intensity value 'b' is set to approximately 20% of the maximum intensity value Max. The first CD value CDa is obtained through the first measurement operation, and the second CD value CDb is obtained through the second measurement operation. Because the first intensity value 'a' is set to be greater than the second intensity value 'b', the measured first CD value CDa is greater than the measured second CD value CDb.

Then, the measured first CD value CDa and the measured second CD value CDb are used to quantify the slope of the intensity waveform of the secondary electrons. Specifically, as illustrated in FIG. 18, in the graph having a horizontal axis representing the intensity of the secondary electrons and a vertical axis representing the measured CD of the hard mask pattern 222, the slope of a straight line 400 passing through both the first coordinates (a, CDa) representing the first CD value CDa at the first intensity 'a' and the second coordinates (b, CDb) representing the second CD value CDa at the second intensity 'b' is calculated. The calculated slope is defined as the intensity slope IS quantifying the slope of the intensity waveform of the secondary electrons. Thus, the intensity slope (IS) is calculated by Equation (1).

$$IS = \frac{(CDa - CDb)}{a - b} \quad (1)$$

In Equation (1), the first CD value CDa and the second CD value CDb represent the actually measured CD, which may be replaced with the CD MTT.

The calculated intensity slope (IS) is used to extract a delta CD $\Delta CD$. The delta CD $\Delta CD$ is not a fixed value but a variable value that varies according to the intensity slope IS. In an exemplary embodiment of the present invention, the delta CD $\Delta CD$ is extracted using a functional equation with variables of the intensity slope IS and the delta CD $\Delta CD$. To this end, a functional equation with variables of the intensity slope IS and the delta CD $\Delta CD$ is defined, and table data satisfying the defined functional equation may be prepared in some cases. The definement of the functional equation and the preparation of the table data may be performed through a plurality of test operations, and the measurement values obtained by the CD correction process may be used to update the functional equation or the table data.

Figure 19:
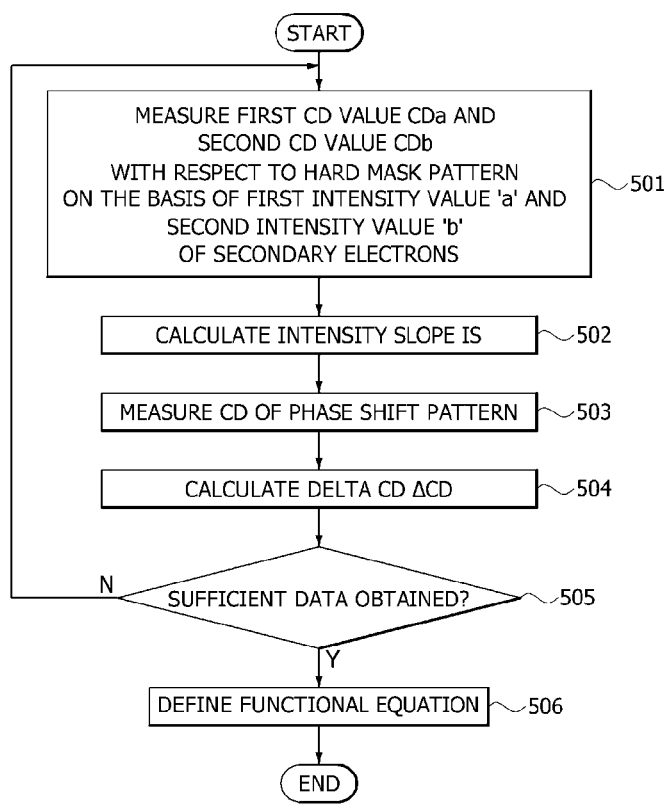
FIG. 19 is a flow chart illustrating a process for defining a functional equation with variables of an intensity slope IS and a delta CD ΔCD.

FIG. 19 is a flow chart illustrating a process for defining a functional equation with variables such as an intensity slope IS and a delta CD $\Delta CD$.

Referring to FIG. 19, after forming the hard mask pattern 222 and the phase shift pattern 212 and removing the resistor pattern 230 as described with reference to FIGS. 6 to 10, the first CD value CDa and the second CD value CDb are measured with respect to the hard mask pattern 222 on the basis of the first intensity value 'a' and the second intensity value 'b' of the secondary electrons that are different from each other (in operation 501). The first intensity value 'a', the second intensity value 'b', the first CD value CDa and the second CD value CDb are used to calculate the intensity slope IS (in operation 502). The intensity slope (IS) is calculated by Equation (1). As illustrated in FIG. 14, the hard mask pattern 222 in the cell region is removed to expose the phase shift pattern 212 in the cell region, and the CD of the exposed phase shift pattern is measured to calculate the delta CD $\Delta CD$ (operations 503 and 504). The delta CD $\Delta CD$ is obtained by comparing the measured CD value of the hard mask pattern 222 with the measured CD value of the phase shift pattern 212.

The CD MTT values may be compared instead of the measured CD values. The first CD value CDa measured on the basis of the first intensity value 'a' is used as the measured CD value of the hard mask pattern 222. In this case, the measurement of the CD of the phase shift pattern 212 is performed on the basis of the first intensity value 'a'. After the delta CD $\Delta CD$ is calculated, the delta CD ($\Delta CD$) value for a certain intensity slope (IS) is obtained. Operations 501 to 504 are repeated until obtaining sufficient data. If it is determined in operation 505 that sufficient delta CD ($\Delta CD$) values are obtained with respect to a plurality of intensity slopes IS, an IS-$\Delta CD$ functional equation is defined (in operation 506).

Figure 20:
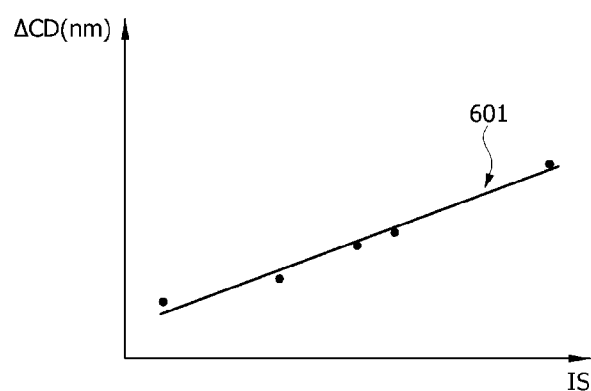
FIG. 20 is a graph illustrating an example of an IS-ΔCD function.

FIG. 20 is a graph illustrating an example of the IS-$\Delta CD$ function obtained through the above process.

As illustrated in FIG. 20, the relationship between the intensity slope IS and the delta CD $\Delta CD$ may be represented by a linear function graph 601 having a certain slope. The linear function graph 601 of FIG. 20 is obtained by performing the process of FIG. 19 on the phase shift pattern 212 with a line/space shape, for example, five times, which can be represented by a linear functional equation Y=1.22X−41.4 (here, X=IS and Y=$\Delta CD$) that has a slope of 1.22 and a y-axis intersection of −41.4. The obtained IS-$\Delta CD$ functional equation is used to extract the delta CD $\Delta CD$ corresponding to the calculated intensity slope IS. That is, as illustrated with reference to FIGS. 17 and 18, the calculated intensity slope (IS) is substituted for the value of the variable X of the functional equation, thereby extracting the delta CD $\Delta CD$ that is the value of the variable Y. The IS-$\Delta CD$ functional equation may vary according to the shape of a pattern. Therefore, if the pattern varies, the IS-$\Delta CD$ functional equation may be set separately for the varied pattern. Also, because the IS-$\Delta CD$ functional equation may vary according to the direction of measurement of the CD of the hard mask pattern 222, the IS-$\Delta CD$ functional equation may be set separately according to the measurement direction.

Figure 11:
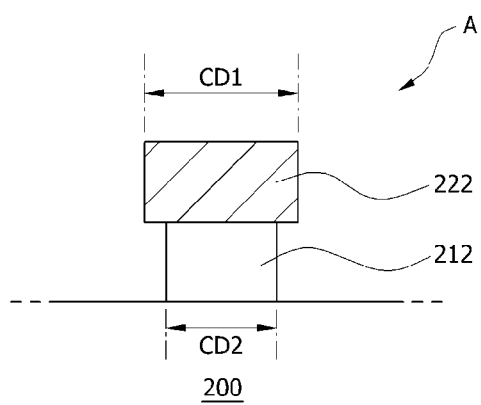
Figure 12:
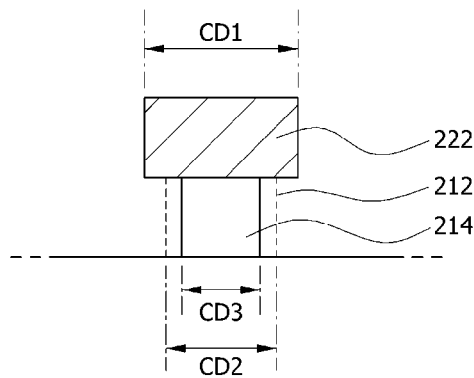

After the extraction of the delta CD $\Delta CD$, the CD (or CD MTT) of the phase shift pattern 212 may be calculated as the difference between the delta CD $\Delta CD$ and the CD (or CD MTT) of the hard mask pattern 222, as illustrated in FIG. 11. After calculation of the CD (or CD MTT) of the phase shift pattern 212, an additional etching process is performed on the phase shift pattern 212 to correct the CD of the phase shift pattern 212 to be equal/close to the designed CD. Specifically, as illustrated in FIG. 12, the uncorrected CD CD2 of the phase shift pattern 212 is calculated by measurement of the CD1 (or CD MTT) of the hard mask pattern 222, and an additional etching operation process is performed, thereby forming the phase shift pattern 214 having the target CD CD3, i.e., the designed CD. Here, the etching amount corresponds to the difference between the designed target CD CD3 and the calculated CD of the phase shift pattern 212. The additional etching operation process may be performed through a plasma-based wet etching process. In this case, because the top of the phase shift pattern is protected by the hard mask pattern, the etching process is performed mainly on the side of the phase shift pattern.

After correction of the CD of the phase shift pattern, a resist pattern 230 is formed to expose a cell region and cover a frame region, as illustrated in FIG. 13. The hard mask pattern 222 in the exposed cell region is removed using the resist pattern 230 as an etch mask. When the resist pattern 230 is removed, the phase shift pattern is arranged in the cell region, and the phase shift pattern and the hard mask pattern are arranged in the frame region to form the phase shift mask, as illustrated in FIG. 14. The hard mask pattern in the frame region acts as a light blocking layer. The CD of the phase shift mask 214 is measured after removal of the hard mask pattern 222, and the measured CD value may be used as data for setting the IS-ΔCD function.

Figure 21:
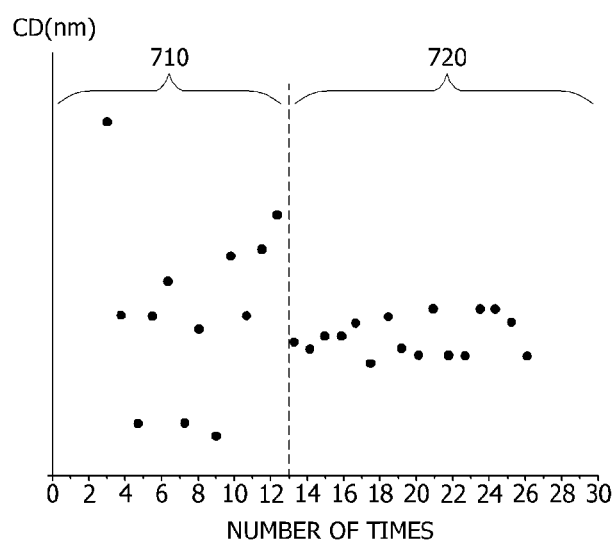
FIG. 21 is a graph illustrating the comparison between a CD error caused by a CD correcting method according to a known art and the CD error caused by the CD correcting method according to the exemplary embodiment of the present invention.

FIG. 21 is a graph illustrating the comparison between a CD error caused by the CD correcting method according to the known art and the CD error caused by the CD correcting method according to the exemplary embodiment of the present invention.

Referring to FIG. 21, it can be seen that the case of the exemplary embodiment of the present invention, that measures the CD of the hard mask pattern on the basis of a plurality of intensity values of the secondary electrons and uses a variable delta CD ΔCD after calculation of the intensity slope IS (720), may reduce the error by about 80%, when compared to the case that measures the CD of the hard mask pattern one the basis of on intensity value of the secondary electrons and uses a fixed delta CD ΔCD (710).

As described above, the present invention calculates the intensity slope IS quantifying the slope of the intensity waveform of the secondary electrons affecting the CD measurement, and sets the delta CD variably as the value corresponding to the intensity slope IS. Accordingly, the present invention can calculate the accurate CD (or CD MTT) of the phase shift pattern and can correct the CD of the phase shift pattern to approach the designed target CD.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for correcting the critical dimension (CD) of a phase shift mask, comprising:
    calculating an intensity slope quantifying a slope of an intensity waveform of secondary electrons emitted by scanning an electron beam spot to a hard mask pattern on a phase shift mask on a substrate;
    extracting a delta critical dimension (CD) value, which is equal to a CD difference between the phase shift pattern and the hard mask pattern, as a delta CD value corresponding to the intensity slope; and
    correcting the CD of the phase shift mask by using the extracted delta CD value.

2. The method of claim 1, wherein the calculating of the intensity slope comprises:
    a first measurement operation of measuring the CD of the hard mask pattern on the basis of a first intensity value of the secondary electrons;
    a second measurement operation of measuring the CD of the hard mask pattern on the basis of a second intensity value of the secondary electrons; and
    calculating a slope of a straight line, which passes through first coordinates comprised of the first intensity value and a first measurement value measured by the first measurement operation and second coordinates comprised of the second intensity value and a second measurement value measured by the second measurement operation, as the intensity slope.

3. The method of claim 2, wherein the first measurement operation and the second measurement operation are performed using a scanning electron microscopy (SEM) equipment.

4. The method of claim 2, wherein the first intensity value is set to approximately 80% of the maximum intensity of the secondary electrons, and the second intensity value is set to approximately 20% of the maximum intensity of the secondary electrons.

5. The method of claim 1, wherein the extracting of the delta CD value is performed using a functional equation with variables of the intensity slope and the delta CD.

6. The method of claim 5, wherein the functional equation is prepared in advance through a plurality of test operations.

7. The method of claim 6, wherein the preparing of the functional equation comprises:
    a first operation of measuring a first CD value and a second CD value for the hard mask pattern on the basis of a first intensity value and a second intensity value of the secondary electrons that are different from each other;
    a second operation of calculating an intensity slope by using the first intensity value, the second intensity value, the first CD value and the second CD value;
    a third operation of calculating a delta CD by measuring the CD of the phase shift pattern after removing the hard mask pattern; and
    defining a functional equation applied to the respective delta CDs corresponding to the intensity slopes obtained by repeating the first operation, the second operation and the third operation a predetermined number of times.

8. The method of claim 1, wherein the phase shift pattern is additionally etched using a plasma-based etching process.

9. A method for manufacturing a phase shift mask, comprising:
    forming a hard mask pattern on a phase shift layer on a substrate;
    forming a phase shift pattern by etching the phase shift layer by using the hard mask pattern as an etch mask;
    calculating an intensity slope quantifying a slope of an intensity waveform of secondary electrons emitted by scanning an electron beam spot to the hard mask pattern;
    extracting a delta critical dimension (CD) value, which is equal to a CD difference between the phase shift pattern and the hard mask pattern, as a delta CD value corresponding to the intensity slope;
    correcting the CD of the phase shift mask by using the extracted delta CD value; and
    removing the hard mask pattern.

10. The method of claim 9, wherein the calculating of the intensity slope comprises:
    a first measurement operation of measuring the CD of the hard mask pattern on the basis of a first intensity value of the secondary electrons;
    a second measurement operation of measuring the CD of the hard mask pattern on the basis of a second intensity value of the secondary electrons; and
    calculating a slope of a straight line, which passes through first coordinates comprised of the first intensity value and a first measurement value measured by the first measurement operation and second coordinates comprised of the second intensity value and a second measurement value measured by the second measurement operation, as the intensity slope.

11. The method of claim 10, wherein the first measurement operation and the second measurement operation are performed using a scanning electron microscopy (SEM) equipment.

12. The method of claim 10, wherein the first intensity value is set to approximately 80% of the maximum intensity of the secondary electrons, and the second intensity value is set to approximately 20% of the maximum intensity of the secondary electrons.

13. The method of claim 9, wherein the extracting of the delta CD value is performed using a functional equation with variables of the intensity slope and the delta CD.

14. The method of claim 13, wherein the functional equation is prepared in advance through a plurality of test operations.

15. The method of claim 14, wherein the preparing of the functional equation comprises:
- a first operation of measuring a first CD value and a second CD value for the hard mask pattern on the basis of a first intensity value and a second intensity value of the secondary electrons that are different from each other;
- a second operation of calculating an intensity slope by using the first intensity value, the second intensity value, the first CD value and the second CD value;
- a third operation of calculating a delta CD by measuring the CD of the phase shift pattern after removing the hard mask pattern; and
- defining a functional equation applied to the respective delta CDs corresponding to the intensity slopes obtained by repeating the first operation, the second operation and the third operation a predetermined number of times.

16. The method of claim 9, wherein the phase shift pattern is additionally etched using a plasma-based etching process.

17. The method of claim 9, wherein the phase shift layer is formed using a molybdenum silicon film.

18. The method of claim 9, wherein the hard mask pattern is formed using a chrome film.

* * * * *